US009255741B2

(12) United States Patent
Sharaf et al.

(10) Patent No.: US 9,255,741 B2
(45) Date of Patent: Feb. 9, 2016

(54) COOLED ELECTRIC ASSEMBLY

(71) Applicant: Lear Corporation, Southfield, MI (US)

(72) Inventors: Nadir Sharaf, Bloomfield Township, MI (US); Aric Anglin, Rives Junction, MI (US); Slobodan Pavlovic, Novi, MI (US)

(73) Assignee: Lear Corporation, Southfield, MI (US)

(*) Notice: Subject to any disclaimer, the term of this patent is extended or adjusted under 35 U.S.C. 154(b) by 230 days.

(21) Appl. No.: 13/750,784

(22) Filed: Jan. 25, 2013

(65) Prior Publication Data

US 2013/0192798 A1 Aug. 1, 2013

Related U.S. Application Data

(60) Provisional application No. 61/591,042, filed on Jan. 26, 2012.

(51) Int. Cl.

| | |
|---|---|
| ***H05K 7/20*** | (2006.01) |
| ***F28D 7/00*** | (2006.01) |
| ***H01C 1/08*** | (2006.01) |
| ***H01C 1/082*** | (2006.01) |
| *F28D 15/02* | (2006.01) |

(52) U.S. Cl.
CPC .. *F28D 7/00* (2013.01); *H01C 1/08* (2013.01); *H01C 1/082* (2013.01); *F28D 15/02* (2013.01)

(58) Field of Classification Search
None
See application file for complete search history.

(56) References Cited

U.S. PATENT DOCUMENTS

| | | | | |
|---|---|---|---|---|
| 3,681,509 | A | 8/1972 | Johnston et al. | |
| 4,478,918 | A | 10/1984 | Ueno et al. | |
| 4,574,112 | A | 3/1986 | Breault et al. | |
| 4,945,010 | A | 7/1990 | Kaufman et al. | |
| 6,031,751 | A | 2/2000 | Janko | |
| 6,156,970 | A | 12/2000 | Harting et al. | |
| 6,309,775 | B1 | 10/2001 | Mank | |
| 6,313,991 | B1 | 11/2001 | Nagashima et al. | |
| 6,414,867 | B2 | 7/2002 | Suzuki et al. | |
| 6,573,616 | B2 | 6/2003 | Yamane | |
| 7,070,873 | B2 | 7/2006 | Imaseki et al. | |
| 7,092,255 | B2 * | 8/2006 | Barson et al. | 361/699 |
| 7,137,829 | B2 | 11/2006 | Onizuka et al. | |
| 7,295,440 | B2 | 11/2007 | Ganev et al. | |
| 7,481,072 | B2 | 1/2009 | Ostrom et al. | |
| 7,813,128 | B2 | 10/2010 | Marchand | |
| 7,823,671 | B2 | 11/2010 | Inoue et al. | |
| 7,864,532 | B1 * | 1/2011 | Ehret et al. | 361/713 |
| 7,911,794 | B2 * | 3/2011 | Hasegawa | 361/700 |
| 8,085,538 | B2 | 12/2011 | Noshadi et al. | |
| 8,094,454 | B2 | 1/2012 | Lowry | |
| 8,203,839 | B2 | 6/2012 | Dede | |
| 8,339,785 | B2 | 12/2012 | Chang et al. | |
| 8,630,092 | B2 * | 1/2014 | Kluge | 361/713 |
| 8,830,676 | B2 * | 9/2014 | Borck et al. | 361/688 |
| 2004/0066643 | A1 * | 4/2004 | Beihoff et al. | 361/816 |

(Continued)

FOREIGN PATENT DOCUMENTS

CA 1108254 A1 9/1981

*Primary Examiner* — Courtney Smith
(74) *Attorney, Agent, or Firm* — MacMillan, Sobanski & Todd, LLC

(57) ABSTRACT

A cooled electric assembly includes a box that defines an interior space. An electrical conductor is located within the interior space. A cooling tube is attached to the box. A thermal conductor is located at least partially within the interior space and is in thermal contact with the electrical conductor and in thermal contact with the cooling tube.

10 Claims, 2 Drawing Sheets

(56) References Cited

U.S. PATENT DOCUMENTS

| | | | | |
|---|---|---|---|---|
| 2005/0064257 | A1 | 3/2005 | Isoda et al. | |
| 2006/0196050 | A1* | 9/2006 | Fujimori et al. | 29/890.035 |
| 2007/0025079 | A1* | 2/2007 | Salmon | 361/688 |
| 2007/0297947 | A1* | 12/2007 | Sommers et al. | 422/100 |
| 2008/0087406 | A1 | 4/2008 | Asfia et al. | |
| 2008/0285230 | A1 | 11/2008 | Bojan et al. | |
| 2008/0295535 | A1 | 12/2008 | Robinet et al. | |
| 2009/0173444 | A1* | 7/2009 | Sago et al. | 156/345.33 |
| 2009/0317680 | A1 | 12/2009 | Imamura et al. | |
| 2010/0014253 | A1* | 1/2010 | Matz et al. | 361/709 |
| 2010/0089620 | A1* | 4/2010 | Matz et al. | 174/252 |
| 2010/0097765 | A1 | 4/2010 | Suzuki et al. | |
| 2012/0287576 | A1* | 11/2012 | Takatsuka et al. | 361/690 |

* cited by examiner

COOLED ELECTRIC ASSEMBLY

CROSS-REFERENCE TO RELATED APPLICATIONS

This application claims the benefit of U.S. Provisional Application No. 61/591,042, filed Jan. 26, 2012, the disclosure of which is incorporated herein by reference.

BACKGROUND OF THE INVENTION

This invention relates in general to a cooled electric assembly. In particular, this invention relates to a system that uses a fluid coolant to remove heat from high voltage electrical conductors.

Many electric vehicles use a source of electric power, such as batteries or fuel cells, to drive a motor. The source of electric power is typically relatively high voltage. During operation of the vehicle, an electric current from the high voltage source is selectively distributed to various vehicle systems using conductors and switches.

The electric current travelling through the electrical systems produces heat. Excessive heat can cause damage to some of the components, and in some instances mechanisms are installed to help remove excess heat. These mechanisms often include heat sinks and cooling systems. These mechanisms often involve circulating a fluid past hot areas in order to remove the heat. Although circulated air is satisfactory to cool some components a liquid coolant may be desirable to remove excess heat from particularly hot or heat-sensitive components, using liquids that are better at conducting heat than air is.

There are disadvantages to using a liquid coolant, however. The liquid coolant can damage the electrical components by, for example, causing corrosion or short circuiting. Therefore, care must often be taken to prevent the liquid from coming into contact with the components, while still allowing the liquid to conduct heat away from the components. It would be advantageous to have an improved system for circulating liquid coolants.

SUMMARY OF THE INVENTION

This invention relates to a cooled electric assembly. The assembly includes a box that defines an interior space. An electrical conductor is located within the interior space. A cooling tube is attached to the box. A thermal conductor is located at least partially within the interior space. The thermal conductor is in thermal contact with the electrical conductor. The thermal conductor is in thermal contact with the cooling tube. The thermal conductor is a heat pipe. At least a portion of the cooling tube is located within the interior space. The box is molded around the cooling tube. A liquid coolant is passed through the cooling tube. The cooling tube extends between a pipe inlet that is located outside the interior space and a pipe outlet that is located outside the interior space. The cooling tube is a seamless tube between the pipe inlet and the pipe outlet. The cooling tube has a relatively constant-cross-section between the pipe inlet and the pipe outlet. A resistor within the interior space of the box is attached to the cooling tube.

Various aspects of this invention will become apparent to those skilled in the art from the following detailed description of the preferred embodiment, when read in light of the accompanying drawings.

DETAILED DESCRIPTION OF THE PREFERRED EMBODIMENT

Figure 1:
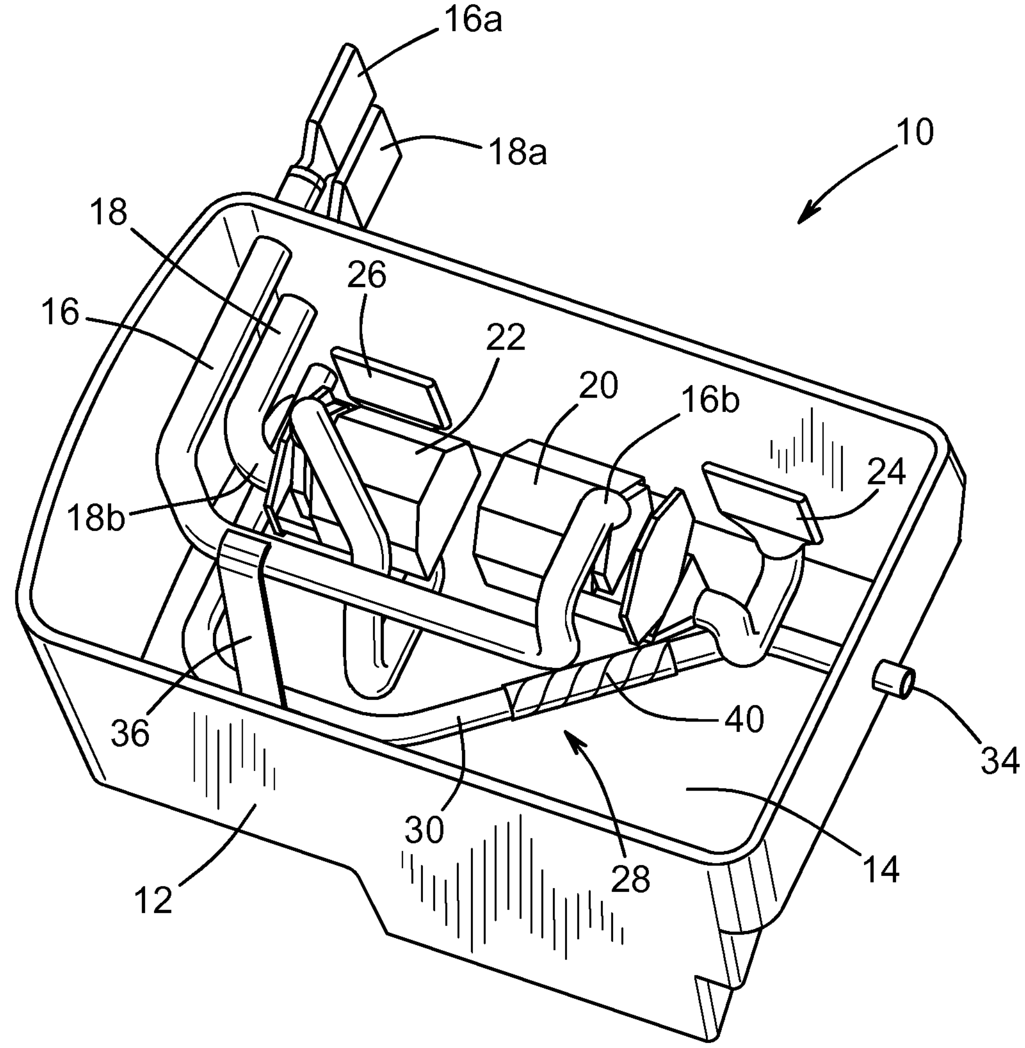
FIG. 1 is a perspective view of an electric distribution assembly.

Referring now to the drawings, there is illustrated in FIG. 1 a cooled electric assembly, indicated generally at 10. The illustrated cooled electric assembly 10 is an electrical contactor assembly, and some components of the electrical contactor assembly are not shown for clarity. The illustrated electrical contactor assembly is suitable for use in an electric vehicle (not shown) that uses a high-voltage power source (not shown) such as fuel cells or batteries. The features described in the cooled electric assembly 10 are also suitable for use in other high-voltage applications.

The cooled electric assembly 10 includes a distribution box 12. The illustrated distribution box 12 is of a generally rectangular shape, but may be other desired shapes. The distribution box 12 defines an interior space 14. A first input bus bar 16 and a second input bus bar 18 are electrically-connected to the power source at respective first ends 16*a* and 18*a*, and have respective second ends 16*b* and 18*b* located within the interior space 14 of the distribution box 12. The first input bus bar 16 is a first electrical conductor and the second input bus bar 18 is a second electrical conductor; both are made of copper, but may be made of any desired electrically-conductive material. Further, the first input bus bar 16 and the second input bus bar 18 may include an outer insulated layer, if desired.

The first input bus bar 16 and the second input bus bar 18 are connected respectively to a first contactor 20 and a second contactor 22. The illustrated first contactor 20 and second contactor 22 are electrically-actuated switches that are used to close a circuit in order to allow power to flow from the first input bus bar 16 to a first output 24, and from the second input bus bar 18 to a second output 26. The illustrated distribution box 12 is made of a molded plastic, although it may be made of other materials suitable to protect the first contactor 20 and the second contactor 22 from damage, such as aluminum or other metals, and it may be made using methods other than molding.

The first output 24 and the second output 26 are electrically connected to provide power to other components (not shown) on the electric vehicle. This can be a high-voltage component, such as a drive motor, or a transformer that is used to convert the high voltage to a lower voltage for use with low-voltage components. Also, it should be appreciated that a low voltage source can be applied to the first input bus bar 16 and the second input bus bar 18, if desired.

When the first input bus bar 16 and the second input bus bar 18 are conducting an electric current, they will generate waste heat. The amount of heat generated determines how efficient the first input bus bar 16 and the second input bus bar 18 are at conducting the electric current. Similarly, the first output 24 and the second output 26 will also generate waste heat as they conduct the electric current. The generated waste heat can be trapped in the distribution box 12, and cause the temperature inside the distribution box 12 to rise. If the temperature rises too high, components of the cooled electric assembly 10 can be damaged. Therefore, the cooled electric assembly 10 includes a cooling system, indicated generally at 28.

Figure 2:
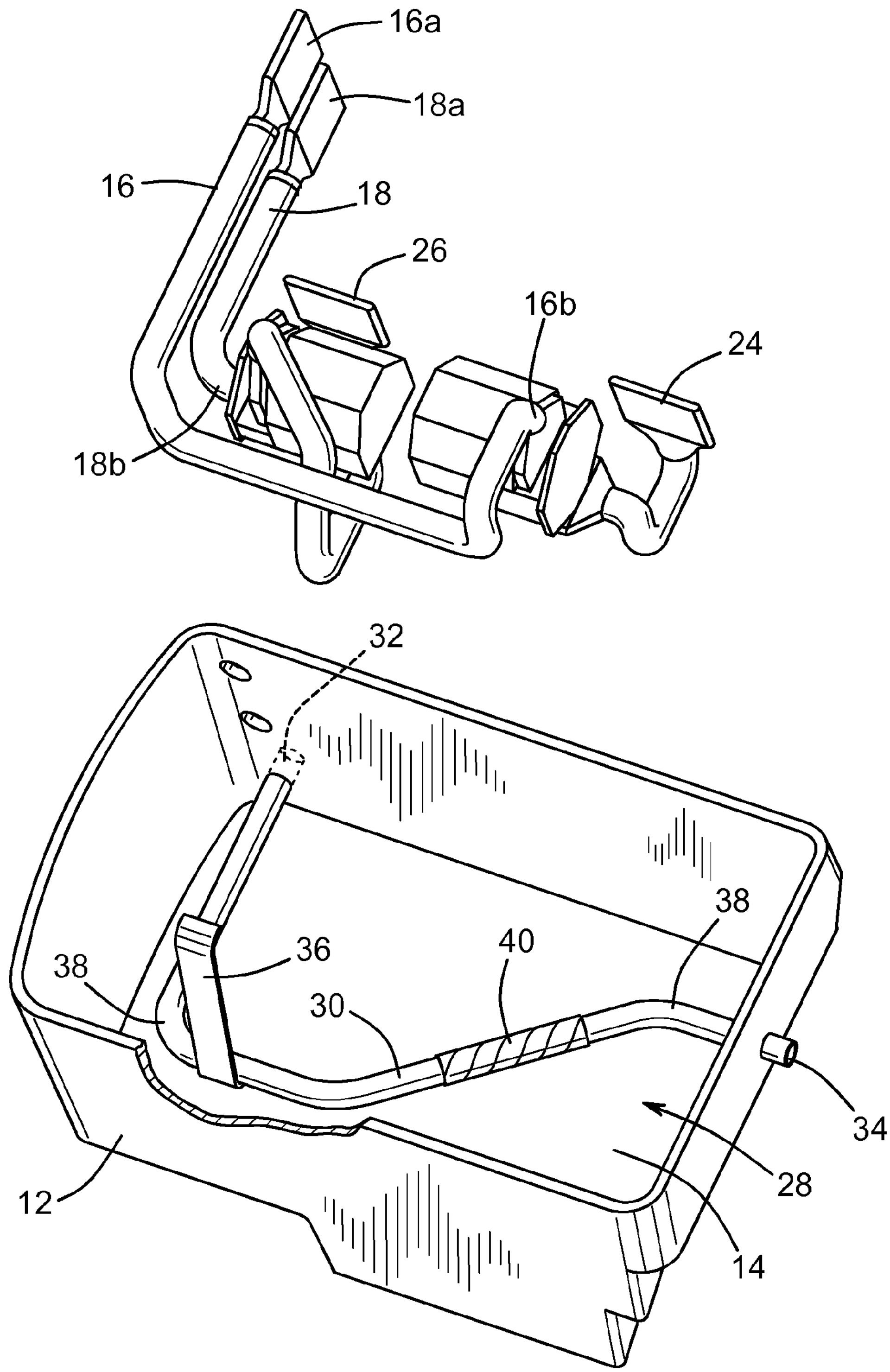
FIG. 2 is a perspective view of the electric distribution assembly of FIG. 1, with some components removed and a portion of a box cut away so that a cooling system is visible.

Referring to FIG. 2, the cooled electric assembly 10 is shown partially exploded and with a portion of the distribution box 12 cut-away so that the cooling system 28 may be more clearly seen. The cooling system 28 includes a cooling tube 30. The illustrated cooling tube 30 is made of aluminum; however, it should also be appreciated that the cooling tube may be made of other desired material that is able to tolerate the anticipated temperature as well as any corrosive characteristics of a coolant, as will be described below. The distribution box 12 is molded around the cooling tube 30. It should be appreciated that this helps position the cooling tube 30 properly relative to the distribution box 12. It should further be appreciated that the cooling tube 30 does not need to be molded into the distribution box 12, and the components may be connected using a different desired mechanism, such as adhesives or bolts. In the illustrated cooled electric assembly 10, a portion of the cooling tube 30 is located within the interior space 14 of the distribution box 12. It should be appreciated that this is not necessary, and the cooling tube 30 may be located outside of the distribution box 14 if desired. For example, the cooling tube 30 could be bolted to an external surface of the distribution box 14 if desired. Further, the cooling tube 30 may be located in a suitable position relative to the distribution box 12 without being attached to the distribution box 12, if desired.

The cooling tube 30 extends between a pipe inlet 32 and a pipe outlet 34. A fluid coolant (not shown) is passed through the cooling tube 30, from the pipe inlet 32 to the pipe outlet 34. The fluid coolant may be pushed or pulled through the cooling tube 30 at a regulated flow rate using any suitable pump and controller, if desired. The specific fluid coolant used will depend on factors such as the amount of heat to be removed and the working temperature. Although air may be used as the fluid coolant, there are liquid coolants, such as a solution of alcohol and water, that are able to more quickly remove greater amounts of heat and may be preferable as the fluid coolant.

The fluid coolant contained in the fluid tube 30 will remove waste heat that reaches the cooling tube 30 through the interior space 14 of the distribution box 12. In order to facilitate removal of waste heat from the first input bus bar 16, the cooling system 28 includes a thermal conductor 36. The thermal conductor 36 is a heat pipe that is in thermal contact with the first input bus bar 16 and the cooling tube 30. The thermal conductor 36 allows waste heat to more easily transfer from the relatively hot first input bus bar 16 to the relatively cool cooling tube 30. The cooling system 28 may include additional thermal conductors (not shown), for example, a second heat pipe may be included in thermal contact with the second input bus bar 18 and the cooling tube 30. The illustrated thermal conductor 36 is in thermal contact with the first input bus bar 16 at limited, discrete positions, and is also in contact with the cooling tube 30 at limited, discrete positions. That is, the thermal conductor 36 is not in contact with the entire portion of the cooling tube 30 that is located within the interior space 14 of the distribution box 12. However, this is not necessary, and one or more thermal conductors may be in contact with the entire portion of the cooling tube 30 that is located within the interior space 14 of the distribution box 12, if desired.

It should be appreciated that while the illustrated cooling system 28 uses heat pipes to transfer heat from the relatively hot locations to the cooling tube 30, other suitable methods of heat transfer may be used, if desired. For example, a heat-conductive heat sink may be used, or the cooling tube 30 may be situated close enough to a hot component for sufficient transfer of heat by convection or conduction. When heat pipes are used with the cooling system 30, it should be appreciated that the size, material, and working fluid of the heat pipes may vary depending on the anticipated heat load and operating temperatures. Further, it should be appreciated that the number of heat pipes installed may be different from that illustrated, depending on the anticipated heat load and locations of waste heat generation.

When using a liquid coolant to cool electrical components, care is normally taken to avoid contact between electrified components and the liquid. This is done to reduce the risk of harm to the components themselves that may be caused by corrosion or by a short circuit. Additionally, it is done to reduce the risk of harm to other components as well as people that could occur if an electrically-conductive liquid contacts a live electric component. The illustrated cooling tube 30 reduces the chance of the fluid coolant coming into contact with any of the electrified components, such as the first input bus bar 16. In the illustrated cooled electric assembly 10, the pipe inlet 32 and the pipe outlet 34 are not located within in the interior space 14 of the distribution box 12. Further, the cooling tube 30 is a seamless tube between the pipe inlet 32 and the pipe outlet 34, having no joints, fittings or other seams. Also, although there may be some variation in the diameter of the cooling tube 30 at corners such as 38 due to normal manufacturing effects, the cooling tube 30 has a relatively constant-cross-section between the pipe inlet 32 and the pipe outlet 34. It should be appreciated that while these characteristics of the cooling system 30 are advantageous, they are not necessary and the cooling tube 30 may include a fitting inside the distribution box 12 if desired. For example, the cooling tube 30 could include a T-fitting, allowing for multiple flow paths within the distribution box 12. It should be appreciated that while the illustrated cooling tube 30 has a circular cross-sectional shape, it may have other desired shapes such as square, rectangular, or some irregular shape.

The cooling system 28 also includes an optional resistor 40 attached to the cooling tube 30. The resistor 40 is an electrically conductive element that serves to reduce the amperage of an applied voltage while producing heat. In the event that an electric voltage needs to be discharged, the resister 40 is used to convert that charge to heat. For example, if the source of electric power for the electric vehicle is fuel cells, there can be a residual charge in the system when the vehicle is stopped. It may be desirable to safely discharge this residual voltage. This may be done by applying that voltage to an electric circuit (not shown) that includes the resistor 40. The applied voltage creates a current through the resistor 40 and converts the electrical energy into heat. The illustrated resistor 40 is a thick film resistor that includes an electrical resistor wrapped around the cooling tube 30. The location of the resistor 40 on the surface of the cooling tube 30 allows for efficient transfer of the waste heat from the resistor 40 to the fluid coolant, while reducing the risk of the resistor 40 contacting the fluid coolant. It should be appreciated that the discharge of residual voltage is only one non-limiting example of what the resistor 40 may be used for.

It should be appreciated that while the illustrated embodiment described the cooling system 28 used in connection with a distribution box 12 on an electric vehicle, this is only one embodiment of the cooling system. The cooling system 28 may be used in other settings where it is desirable to remove excess heat from an enclosed space.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A cooled electric assembly comprising:

a box that defines an interior space;

an electrical conductor located within the interior space of the box;

a cooling tube having at least a portion that is located within the interior space of the box; and a thermal conductor in thermal contact with both the electrical conductor and the cooling tube;

characterized in that a resistor included in an electric circuit is disposed within the interior space of the box and is attached to the portion of the cooling tube that is located within the interior space of the box, and wherein the cooling tube extends between a pipe inlet that is located outside the interior space of the box and a pipe outlet that is located outside the interior space of the box.

2. The cooled electric assembly of claim 1, wherein the thermal conductor is in thermal contact with limited, discrete positions of the cooling tube.

3. The cooled electric assembly of claim 1, further comprising a second electrical conductor located within the interior space of the box; and a second thermal conductor in thermal contact with both the second electrical conductor and the cooling tube.

4. The cooled electric assembly of claim 1, wherein the box is connected to a portion of the cooling tube.

5. The cooled electric assembly of claim 1, wherein the cooling tube is adapted to pass a liquid coolant therethrough.

6. The cooled electric assembly of claim 1, wherein the cooling tube is a seamless tube between the pipe inlet and the pipe outlet.

7. The cooled electric assembly of claim 6, wherein the cooling tube has a relatively constant-cross-section between the pipe inlet and the pipe outlet.

8. The cooled electric assembly of claim 6, wherein the box is connected to portions of the cooling tube.

9. The cooled electric assembly of claim 6, wherein the thermal conductor is in thermal contact with the cooling tube at limited, discrete positions thereof.

10. A cooled electric assembly comprising:

a box that defines an interior space;

an electrical conductor located within the interior space of the box;

a seamless cooling tube located within the interior space of the box and extending between a pipe inlet that is located outside the interior space of the box and a pipe outlet that is located outside the interior space of the box, wherein at least a portion of the cooling tube is located within the interior space of the box;

a thermal conductor in thermal contact with both electrical conductor and the cooling tube; and a resistor within the interior space of the box and attached to the cooling tube, the resistor included in an electric circuit.

* * * * *